(12) United States Patent
Fiolka (10) Patent No.: US 9,128,389 B2
(45) Date of Patent: Sep. 8, 2015

(54) METHOD FOR MODIFYING A POLARIZATION DISTRIBUTION IN MICROLITHOGRAPHIC PROJECTION EXPOSURE APPARATUS, AND MICROLITHOGRAPHIC PROJECTION EXPOSURE APPARATUS

(75) Inventor: Damian Fiolka, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 498 days.

(21) Appl. No.: 13/010,145

(22) Filed: Jan. 20, 2011

(65) Prior Publication Data

US 2011/0122382 A1 May 26, 2011

Related U.S. Application Data

(63) Continuation of application No. PCT/EP2009/004372, filed on Jun. 17, 2009.

(60) Provisional application No. 61/082,634, filed on Jul. 22, 2008.

(30) Foreign Application Priority Data

Jul. 22, 2008 (DE) .......................... 10 2008 040 611

(51) Int. Cl.
*G03B 27/42* (2006.01)
*G03F 7/20* (2006.01)

(52) U.S. Cl.
CPC .................................. *G03F 7/70566* (2013.01)

(58) Field of Classification Search
CPC ............ G03F 7/70566; G03F 7/70308; G03F 7/70191; G03F 7/70091; G03F 7/705; G03F 7/70058; G03F 7/70158; G03F 7/70075; G03F 1/36; G03F 7/70141; G03F 7/706; G03F 7/70125; G03F 7/70258; G03F 7/70325; G03F 7/70433; G03F 7/70583
USPC .............................. 355/52, 53, 63, 67, 71, 77
See application file for complete search history.

(56) References Cited

U.S. PATENT DOCUMENTS

| 7,061,582 B2 | 6/2006 | Zinn et al. |
| 2005/0146704 A1 | 7/2005 | Gruner et al. |
| 2006/0192149 A1 | 8/2006 | Van Dam et al. |

(Continued)

FOREIGN PATENT DOCUMENTS

| JP | 08-313842 | 11/1996 |
| JP | 2005-005521 | 1/2005 |

(Continued)

OTHER PUBLICATIONS

German Office Action for Germany Appl No. DE 10 2008 040 611.2, with English translation, dated Feb. 16, 2009.

(Continued)

*Primary Examiner* — Mesfin T Asfaw
(74) *Attorney, Agent, or Firm* — Fish & Richardson P.C.

(57) ABSTRACT

The disclosure relates to a method for modifying a polarization distribution in a microlithographic projection exposure apparatus, and to a microlithographic projection exposure apparatus. The projection exposure apparatus has an illumination device and a projection objective. The illumination device has an optical axis and a correction arrangement having a lambda/4 plate arranged rotatably about the optical axis and/or a lambda/2 plate arranged rotatably about the optical axis. The method includes determining a polarization distribution in a predetermined plane of the projection exposure apparatus, and rotating the lambda/4 plate and/or the lambda/2 plate about the optical axis so that a local variation of the polarization distribution is reduced after rotation in comparison with the state before the rotating.

35 Claims, 7 Drawing Sheets

(56) References Cited

U.S. PATENT DOCUMENTS

| | | |
|---|---|---|
| 2007/0146676 A1 | 6/2007 | Tanitsu et al. |
| 2007/0165202 A1* | 7/2007 | Koehler et al. ............... 355/67 |
| 2007/0188730 A1 | 8/2007 | Takeuchi et al. |
| 2007/0195305 A1 | 8/2007 | Mulder et al. |
| 2008/0074632 A1 | 3/2008 | Tanitsu et al. |
| 2008/0218725 A1 | 9/2008 | Fiolka |

FOREIGN PATENT DOCUMENTS

| | | |
|---|---|---|
| JP | 2006-237616 | 9/2006 |
| JP | 2007-180088 | 7/2007 |
| JP | 2008-066565 | 3/2008 |
| WO | WO 2005/026843 | 3/2005 |
| WO | WO 2007/039519 | 4/2007 |
| WO | WO 2007/039519 | 12/2007 |

OTHER PUBLICATIONS

International Search Report and Written Opinion for the corresponding PCT Application No. PCT/EP2009/004372, dated Oct. 27, 2009.

English translation and Japanese office action for Japan Patent Application No. 2011-519048, dated Mar. 12, 2013.

* cited by examiner

METHOD FOR MODIFYING A POLARIZATION DISTRIBUTION IN MICROLITHOGRAPHIC PROJECTION EXPOSURE APPARATUS, AND MICROLITHOGRAPHIC PROJECTION EXPOSURE APPARATUS

CROSS-REFERENCE TO RELATED APPLICATIONS

This application is a continuation of, and claims benefit under 35 USC 120 to, international application PCT/EP2009/004372, filed Jun. 17, 2009, which claims benefit of German Application No. 10 2008 040 611.2, filed Jul. 22, 2008 and U.S. Ser. No. 61/082,634, filed Jul. 22, 2008. International application PCT/EP2009/004372 is hereby incorporated by reference in its entirety.

FIELD

The disclosure relates to a method for modifying a polarization distribution in a microlithographic projection exposure apparatus, and to a microlithographic projection exposure apparatus. The disclosure also relates to an illumination device of a microlithographic projection exposure apparatus.

BACKGROUND

Microlithography is used for producing microstructured components such as integrated circuits or LCDs, for example. The microlithography process is carried out in a so-called projection exposure apparatus having an illumination device and a projection objective. In this case, the image of a mask (reticle) illuminated via the illumination device is projected, via the projection objective, onto a substrate (e.g. a silicon wafer) coated with a light-sensitive layer (photoresist) and arranged in the image plane of the projection objective, in order to transfer the mask structure to the light-sensitive coating of the substrate.

It is known that, in the microlithography process, the imaging contrast can be significantly improved if the mask is illuminated with linearly polarized light, wherein the preferred direction of this polarization is expediently parallel to the longitudinal direction of the grating structures present on the mask. In this case, an as far as possible constant polarization distribution in the entire reticle field is also desirable for a constant imaging contrast and hence a defect-free imaging of the grating structures.

In this case, however, the problem can occur that a polarization distribution originally present (generally linear polarization upon entry into the illumination system) can be altered to different extents by polarization-influencing effects (e.g. stress birefringence induced by mount components in the material of the optical components such as, for example, lenses, polarization-influencing effects of dielectric layers, etc.).

US 2007/0146676 A1 discloses, among other things, arranging in a pupil plane of the illumination device, or in the vicinity thereof, a polarization manipulator for converting the polarization state, which has a plurality of variable optical rotator elements that can be used to rotate the polarization direction of impinging, linearly polarized light with a variably adjustable rotation angle. The variable rotation angle or polarization state provided by the rotator elements can be set in accordance with the measurement result supplied by a device for measuring the polarization state.

SUMMARY

The disclosure provides a method for modifying a polarization distribution in a microlithographic projection exposure apparatus, and a microlithographic projection exposure apparatus, which enable a greater homogeneity of the polarization state to be achieved in a predetermined plane.

In some embodiments, a projection exposure apparatus has an illumination device and a projection objective. The illumination device has an optical axis and a correction arrangement having a lambda/4 plate arranged rotatably about the optical axis and/or a lambda/2 plate arranged rotatably about the optical axis. The method includes determining a polarization distribution in a predetermined plane of the projection exposure apparatus. The method also includes rotating the lambda/4 plate and/or the lambda/2 plate about the optical axis so that a local variation of the polarization distribution is reduced after the rotating in comparison with the state before the rotating.

The disclosure is based on the concept of setting a defined polarization state (in particular at the entrance into the illumination device) in a targeted manner with regard to ellipticity and/or polarization direction, via a correction arrangement including a lambda/4 plate and/or a lambda/2 plate, in a manner dependent on the previously determined polarization distribution to achieve an improvement in the homogeneity of the polarization distribution in the relevant plane.

In this case, the disclosure is based on the insight, in particular, that such a polarization state set in a targeted manner via the correction arrangement, even when it deviates with regard to the polarization direction (adjustable by the lambda/2 plate) and/or with regard to the ellipticity (adjustable by the lambda/4 plate) from a polarization state that is desired in principle with regard to the structure to be imaged (e.g. a state with exactly linearly polarized light having a polarization direction in the x direction or in the y direction), can lead to an improvement in the homogeneity of the polarization distribution in the relevant predetermined plane.

A value which is referred to hereinafter as IPS PV value and defined below can serve for quantitatively describing the homogeneity of the polarization distribution in the relevant predetermined plane. The degree of realization of a desired polarization state at a specific location is referred to as "IPS value", and its averaging over the scanning direction is referred to as "scanned IPS value". In this case, IPS is the abbreviation of "Intensity in Preferred State", and the IPS value specifies the energetic ratio of the light intensity in the desired polarization state (which can be measured, for example, for a desired linear polarization state via an ideal polarizer whose transmission direction is set in the desired direction) to the total intensity. In this case, the desired polarization state can also be, for example, a state with circular polarization (in which case circular light should also be used as desired polarization). The IPS PV value (PV="Peak-to-Value") of a distribution of the scanned IPS value is defined as the difference between maximum and minimum IPS value ($PV=IPS_{max}-IPS_{min}$) and is referred to hereinafter as IPS PV value.

According to the disclosure, therefore, the correction arrangement is not utilized for instance for setting the pupil plane of the illumination device to maximum performance with regard to the polarization. Rather, the IPS PV value is manipulated in the predetermined plane by way of a targeted setting of the correction arrangement including lambda/2 plate and lambda/4 plate. The targeted setting is effected in a manner dependent on the previously determined polarization distribution.

In certain embodiments, the rotating is effected in such a way that, in the local distribution of a parameter (IPS value) that is characteristic of the degree of realization of a specific polarization state in the predetermined plane, the difference between the maximum value and the minimum value of the parameter (IPS PV value) is reduced by at least 10% (e.g., by at least 25%, by at least 50%) in comparison with the state before the rotating.

In some embodiments, the illumination device has a device for changing the angle distribution of light passing through the illumination device, wherein the correction arrangement is arranged upstream of the device in the light propagation direction for changing the angle distribution. In particular, the correction arrangement can be situated in a beam feeding unit of the illumination device. The optical element for changing the angle distribution can be a diffractive optical element (DOE) or a mirror arrangement including a multiplicity of micromirrors (that are adjustable in particular independently of one another), as is known, for example, from WO 2005/026843 A2.

Positioning of the correction arrangement upstream of the device for changing the angle distribution is expedient in so far as the correction arrangement only sets a global offset with regard to ellipticity and/or polarization direction without introducing an angle or field dependence. Setting an offset here means setting a defined polarization state in particular at the entrance into the illumination device, wherein the polarization state deviates depending on the determined polarization distribution with regard to the polarization direction (by deviating from the desired polarization direction, e.g. x direction or y direction) or with regard to the ellipticity (by deviating e.g. from a desired, exactly linear polarization state) from the polarization state that is desired in principle with regard to the mask structure to be imaged.

In certain embodiments, a further retardation element (in particular a second lambda/2 plate) is introduced into the beam path so that it extends only over a partial region of the light beam cross section of light passing through. In this case, in particular, a region of the light beam cross section of light passing through which is covered by the further retardation element or the second lambda/2 plate can be set in a manner dependent on the measurement result of the polarization measuring device.

Such a further retardation element extending only over a partial region of the light beam cross section can improve the efficacy of the method according to the disclosure in situations in which an offset set via the correction arrangement, owing to an unfavorable profile of the ellipticity or the polarization direction, can be achieved in specific partial regions of the relevant plane (e.g. reticle plane or wafer plane) only at the expense of a deterioration in other partial regions without further measures.

In such cases, the further retardation element or the second lambda/2 plate makes it possible, in the last-mentioned partial regions, to invert the chirality of an existing ellipticity of the polarization state (such that, for example, on account of the use of the second lambda/2 plate, the polarization states in one field region correspond to those in another field region with regard to the chirality of the ellipticity) and, if appropriate, to mirror the orientation of the polarization at the optical axis of the lambda/2 plate, such that the correction concept according to the disclosure by rotating the lambda/4 plate and/or the (first) lambda/2 plate of the correction arrangement can then advantageously be applied to the polarization distribution provided by the additional lambda/2 plate.

In this case, the disclosure is not restricted to the manipulation of the local variation of the polarization state in a field plane, but can also advantageously be employed if a pronounced inhomogeneity with regard to the retardation and/or with regard to the rotation of the polarization direction is present in a pupil plane. In this case, the use of an additional retardation element—or a second lambda/2 plate—partially covering the optically active region of a plane perpendicular to the optical axis is advantageous if, for example, in the pupil plane, a positive birefringence is present in a first region of the light beam cross section and a negative birefringence is present in a second region of the light beam cross section. In this case, too, the use of the further retardation element or the second lambda/2 plate is expedient in order partially to cover the region having the initially "incorrect" chirality and in this way to provide the "correct" chirality in this region. The correction concept according to the disclosure can then be applied to the resultant IPS distribution in the pupil plane, in which concept, through suitable rotation of the lambda/4 plate and/or of the lambda/2 plate of the correction arrangement, a partial compensation of those polarization states which cause minimum IPS values is brought about with regard to the ellipticity and/or polarization direction.

The disclosure furthermore relates to a microlithographic projection exposure apparatus, wherein the projection exposure apparatus has an illumination device and a projection objective. The illumination device includes a correction arrangement having a lambda/4 plate arranged rotatably about an optical axis of the illumination device and/or a lambda/2 plate arranged rotatably about the optical axis of the illumination device. The illumination device also includes a polarization measuring device for determining a polarization distribution in a predetermined plane of the projection exposure apparatus. The illumination device further includes a further retardation element, wherein a region of the light beam cross section of light passing through which is covered by the further retardation element is variably adjustable in a manner dependent on the measurement result of the polarization measuring device.

With regard to advantages and preferred configurations of the apparatus, reference is made to the above explanations in connection with the method according to the disclosure.

The disclosure furthermore relates to a method for microlithographically producing micro structured components.

Further configurations of the disclosure can be gathered from the description and the dependent claims.

BRIEF DESCRIPTION OF THE DRAWINGS

The disclosure is explained in more detail below on the basis of exemplary embodiments illustrated in the accompanying figures, in which.

DETAILED DESCRIPTION OF THE PREFERRED EMBODIMENTS

Figure 1:
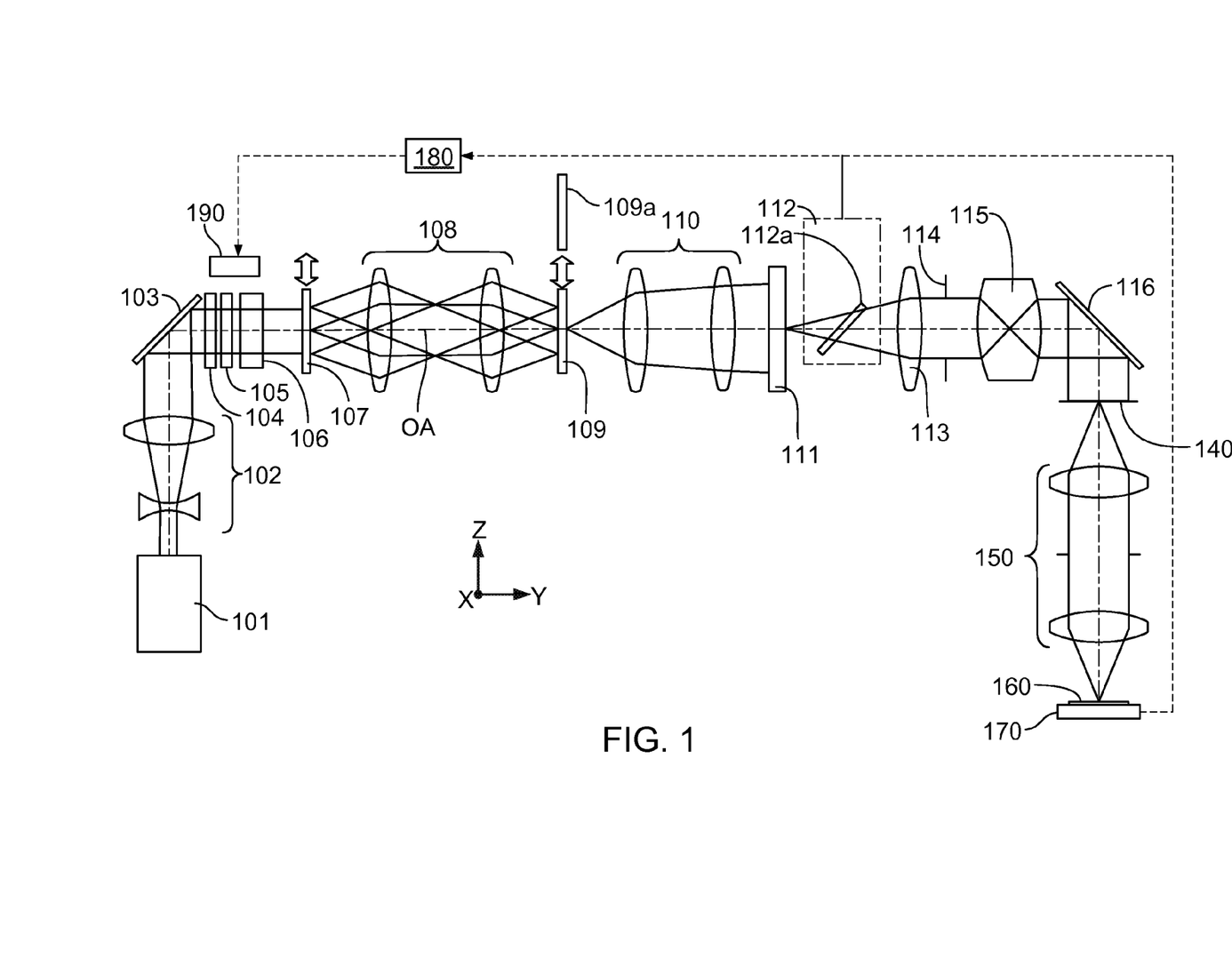
FIG. 1 shows a schematic illustration of a microlithographic projection exposure apparatus in accordance with an embodiment in which the method according to the disclosure is realized.

In accordance with FIG. 1, the microlithographic projection exposure apparatus includes an illumination device and a projection objective 150. The illumination device serves for illuminating a structure-bearing mask (reticle) 140 with light from a light source unit 101, which includes for example an ArF laser for an operating wavelength of 193 nm and a beam shaping optical unit 102, which produces a parallel light beam. The illumination device furthermore has a deflection mirror 103.

The illumination device furthermore has a group including a lambda/4 plate 104, a lambda/2 plate 105 and a depolarizer 106. In this case, the lambda/4 plate 104 and the lambda/2 plate 105 are utilized as a correction arrangement in the context of the present disclosure. The function of the correction arrangement is described in more detail below. The lambda/4 plate 104 and the lambda/2 plate 105 are fitted rotatably about the optical axis OA of the illumination device. The depolarizer 106 is fitted in such a way that it can be removed from the beam path. Although depolarizer 106 is provided in the exemplary embodiments shown in FIG. 1 and FIG. 4, it is removed from the beam path in each case in the embodiments of the disclosure described subsequently and is optional, in principle.

The group including lambda/4 plate 104, lambda/2 plate 105 and depolarizer 106 is followed by a diffractive optical element 107, which, as indicated, can be removed from the beam path, a zoom unit 108, a further diffractive optical element 109 (interchangeable with, for example, a further diffractive optical element 109a) and a further zoom unit 110, downstream of which follows a microlens array 111. Instead of the diffractive optical elements 107 and 109, for setting a desired angle characteristic, it is also possible to provide a mirror arrangement including a multiplicity of micromirrors (that are adjustable in particular independently of one another), as known, for example, from WO 2005/026843 A2.

In accordance with the exemplary embodiment from FIG. 1, in the beam path there furthermore follows a unit 112 (optional at this point) for monitoring the polarization state with a beam splitter 112a, a converging lens 113, a diaphragm unit 114 with downstream imaging system 115 and a deflection mirror 116, downstream of which an imaging onto the structure-bearing mask (reticle) 140 arranged in a field plane takes place. The structure-bearing mask 140 is imaged onto a substrate 160- or a wafer—provided with a light-sensitive layer via the projection objective 150.

The projection exposure apparatus 100 furthermore has a polarization measuring device 170 for determining the polarization state of the light arriving in the wafer plane, and a control device 180 for driving (explained in even more detail below) the correction arrangement including the lambda/4 plate 104 and the lamba/2 plate 105 in a manner dependent on the polarization state determined by the polarization measuring device 170. As an alternative or in addition, the polarization state can also be determined in the reticle plane provided for accommodating the mask (reticle) 140.

In accordance with FIG. 1, the polarization measuring device 170 supplies information about the polarization state and hence the IPS distribution in the wafer plane PP, such that the IPS profile in the wafer plane can correspondingly be set or readjusted by the feedback via the control device 180 and the correction arrangement including the lambda/4 plate 104 and the lambda/2 plate 105.

Figure 7:
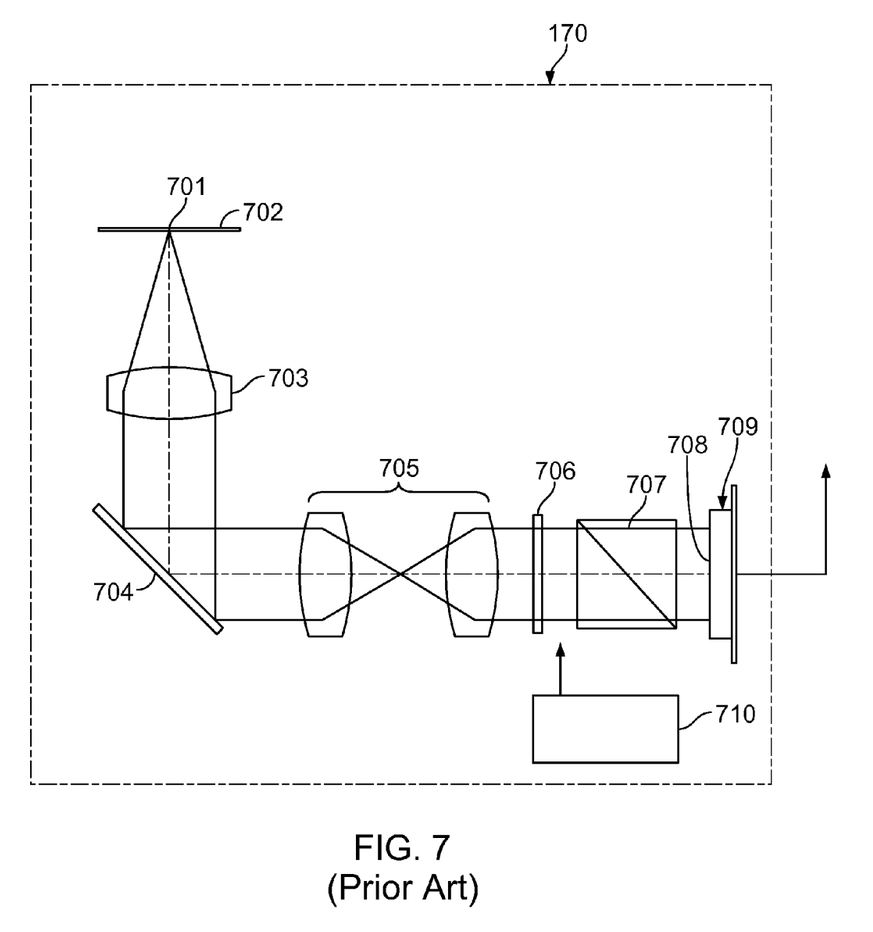
FIG. 7 shows a schematic illustration of a measuring device known per se for determining the polarization state, this measuring device being used in the projection exposure apparatus from FIG. 1 or FIG. 4.

One possible construction of the polarization measuring device 170 is disclosed in US 2007/014667 A1 and is illustrated in FIG. 7 taken from this published patent application. Accordingly, the polarization measuring device 170 has a perforated plate 702 provided with a hole (pinhole) 701, wherein light that has passed through the hole 701 passes through a converging lens 703 and, after reflection at a deflection mirror 704, passes through a lens system 705. In the light propagation direction there follow a lambda/4 plate 706, which can be rotated about the optical axis via a setting device 710, and a polarization beam splitter cube 707, downstream of which is arranged a two-dimensional CCD sensor arrangement 709 provided with a sensor layer 708, wherein the light intensity of the light impinging on the CCD sensor arrangement 709 can be varied by rotating the lambda/4 plate 706, and wherein the polarization state of the light can be deduced from the measurement signal of the CCD sensor arrangement 709.

An explanation is given below, referring to FIG. 2 and FIG. 3, of how a setting of the correction arrangement including lambda/4 plate 104 and the lambda/2 plate 105 in a manner dependent on the measurement result supplied by the polarization measuring device 170 is effected according to the disclosure. In this case, typical values of the rotation angle of the lamba/4 plate 104 and/or of the lambda/2 plate 105 may lie merely by way of example (in each case relative to a basic setting in which they are operated in the characteristic state) in the range of approximately −20° to +20°, in particular at approximately −10° to +10°.

Figure 2A:
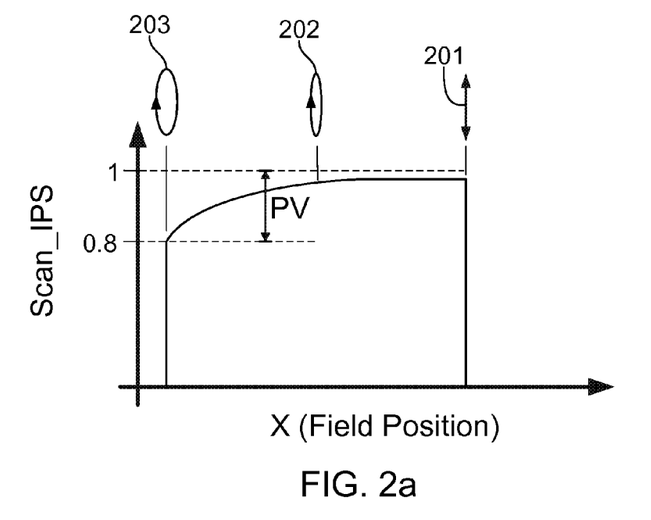
FIGS. 2-3 show diagrams each illustrating the field-dependent profile of the scanned IPS values, before and respectively after carrying out a correction via the method according to the disclosure.

FIG. 2a shows a measured field profile of the scanned IPS values, in which the scanned IPS value rises from a value of approximately scan IPS=0.8 at the left-hand field edge up to a value of approximately scan IPS=1.0 at the right-hand field edge. Polarization states 201 which can lead to such a profile are indicated schematically above the diagram of FIG. 2a, and likewise in the further diagrams of FIGS. 2b, 3a-b, 5a-b and 6a-b.

Accordingly, in accordance with FIG. 2a, in the state before correction, a polarization state 201 with linearly polarized light having exactly the desired direction (e.g. y direction) is present at the right-hand field edge, a polarization state 203 with relatively highly elliptically polarized light is present at the left-hand field edge, and a polarization state 202 with light significantly more weakly elliptically polarized in comparison with the left-hand field edge is present in the field center.

The profile of the IPS value in accordance with FIG. 2a in dependence on the field position (that is to say from left to right in the diagram) corresponds to a quadratic dependence of the IPS value on the ellipticity. If it is assumed, for example, that the linearly polarized light obtained at the right-hand field edge (that is to say on the right in the diagram of FIG. 2a) is obtained without any influence of birefringence, that is to say on account of a retardation of 0 nm, and the comparatively weakly elliptically polarized light corresponding to an IPS loss of 5% arises in the field center on account of a retardation of 2 nm, the IPS loss at the left-hand field edge, where relatively highly elliptically polarized light arises on account of a retardation of 4 nm, has not double but quadruple the value compared with the right-hand field edge. In other words, the curve for the IPS profile falls relatively rapidly even though the disturbance rises only linearly.

Figure 2B:
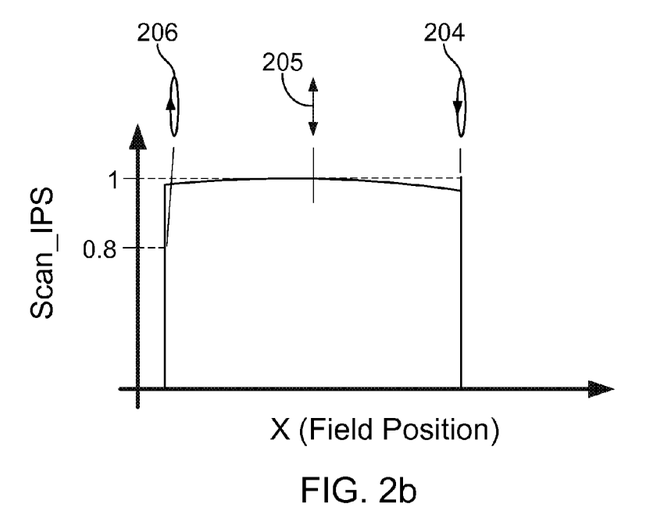

According to the disclosure, as is illustrated in FIG. 2b, the correction arrangement including lambda/4 plate and lambda/2 plate is then set in such a way that, in the field center, the elliptical polarization state that was previously present is just cancelled out precisely by an opposite ellipticity, that is to say that a retardation of opposite sign for compensation in the field center is set at the entrance into the illumination device. Upon entry into the illumination device, in accordance with the example from FIG. 2b, a polarization state with elliptical polarization is thus set in a targeted manner in order to bias the ellipticity of the polarization state which is brought about by the system for the field center, which is effected by suitable rotation of the lambda/4 plate 104 of the correction arrangement about the optical axis OA.

At the right-hand field edge it is evident in FIG. 2b that the previously ideal polarization state 201 was disturbed since a polarization state 204 with slightly elliptically polarized light was obtained after the correction, such that an impediment in the polarization state was obtained in this region. In the case of the polarization state 206 obtained at the left-hand field edge on account of the correction, although ellipticity is still present, this ellipticity is nevertheless weaker than before the correction. In the field center, a polarization state 205 having exactly the desired polarization direction now results.

For the retardation values specified in the above example, this means that as a result a retardation of 0 nm is produced for the field center, a retardation of +2 nm is produced at the left-hand field edge and a retardation of −2 nm is produced at the right-hand field edge. The circumstance that the profile of the IPS value is a quadratic function of the disturbance has the consequence that a relatively great improvement in the polarization state or in the IPS value is produced at the left-hand field edge, this improvement being opposed by a comparatively less pronounced impediment in the polarization state or in the IPS value at the right-hand field edge. Overall the IPS PV value was improved by a factor of 4, namely from a value of 100%−80%=20% before the correction to a value after the correction of 100%−95%=5%. In particular, the impediment of the IPS value (as a result of the setting of the polarization state 204 that is now slightly elliptical after the correction) obtained in the right-hand section of the curve from FIG. 2b is significantly less pronounced than the improvement (as a result of the setting of the likewise only weakly elliptical polarization state 206) obtained in the left-hand field region, which was particularly poor beforehand with regard to the IPS value.

A further exemplary embodiment is explained with reference to FIGS. 3a-b, wherein the correction according to the disclosure here, in contrast to FIGS. 2a-b, is not obtained by setting the phase or the ellipticity of the polarization state, but rather by varying the orientation of the polarization over the field.

Figure 3A:
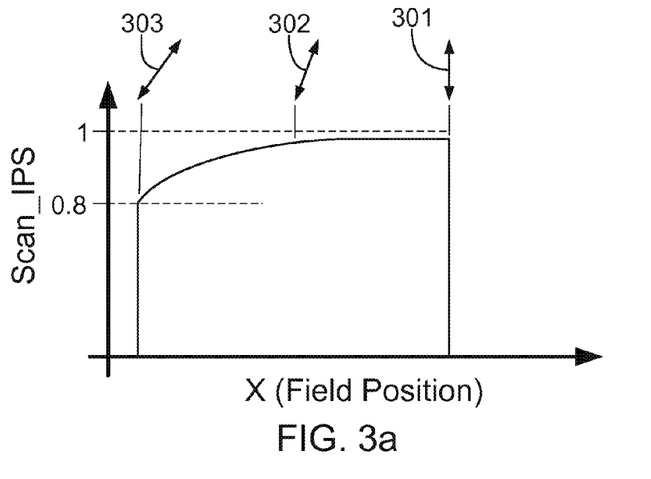
Figure 3B:
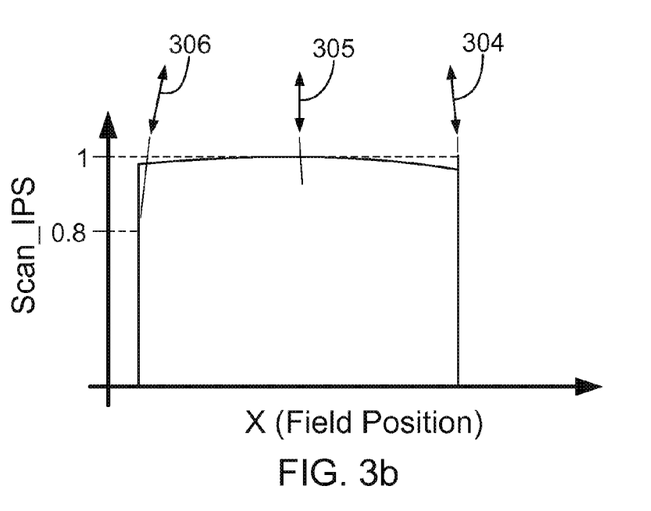

The dependence of the IPS value on the orientation of the polarization is also a quadratic function, such that the correction in accordance with FIGS. 3a-b proceeds analogously to that from FIGS. 2a-b, with the difference that here a specific orientation of the polarization state rather than a birefringence or ellipticity is biased.

In accordance with FIG. 3a, before the correction, a polarization state 301 having exactly the desired polarization direction (e.g. y direction) is present at the right-hand field edge, while this polarization direction is increasingly rotated in the polarization state 302 obtained in the field center and in the polarization state 303 obtained at the left-hand field edge. In the case of the correction according to the disclosure, in accordance with FIG. 3b, the rotation of the system for the field center is then biased, such that a polarization state 305 having exactly the desired polarization direction (e.g. y direction) just results after the correction in the field center. Upon entry into the illumination device, in accordance with the example from FIG. 3, therefore, a polarization state having a polarization direction rotated relative to the polarization direction that is to be striven for in principle with regard to the mask structure to be imaged is set in a targeted manner in order to bias the rotation of the polarization direction which is brought about by the system for the field center, which is effected via suitable rotation of the lambda/2 plate 105 of the correction arrangement about the optical axis OA.

The circumstance that the profile of the IPS value is a quadratic function of the disturbance has the consequence here in turn, analogously to FIGS. 2a-b, that a relatively great improvement is produced at the left-hand field edge, with this improvement being opposed by a comparatively less pronounced impediment at the right-hand field edge. Here, too, the IPS PV value was improved overall by a factor of 4 (from a value of 20% before the correction to a value of approximately 5% after the correction). In particular, the impediment (as a result of the setting of the polarization state 304 that is now slightly rotated after the correction) obtained in the right-hand section of the curve from FIG. 3b is significantly less pronounced than the improvement (as a result of the setting of the polarization state 306 that is likewise only weakly rotated) obtained in the left-hand field region, which was poor beforehand with regard to the IPS value.

Generally, it is also possible (by way of a combination of the exemplary embodiments from FIGS. 2a-b and 3a-b), via the correction arrangement according to the disclosure including lambda/4 plate 104 and lambda/2 plate 105, to set both the ellipticity (via the lambda/4 plate) and the orientation (via the lamba/2 plate) of the polarization state.

An explanation will now be given below of further exemplary embodiments wherein, unlike in FIGS. 2 and 3, the IPS values are not worse at one field edge than at the other, opposite field edge, rather equally poor IPS values are present at opposite field edges, wherein now a comparatively good or optimum IPS value is present in the field center.

Figure 4:
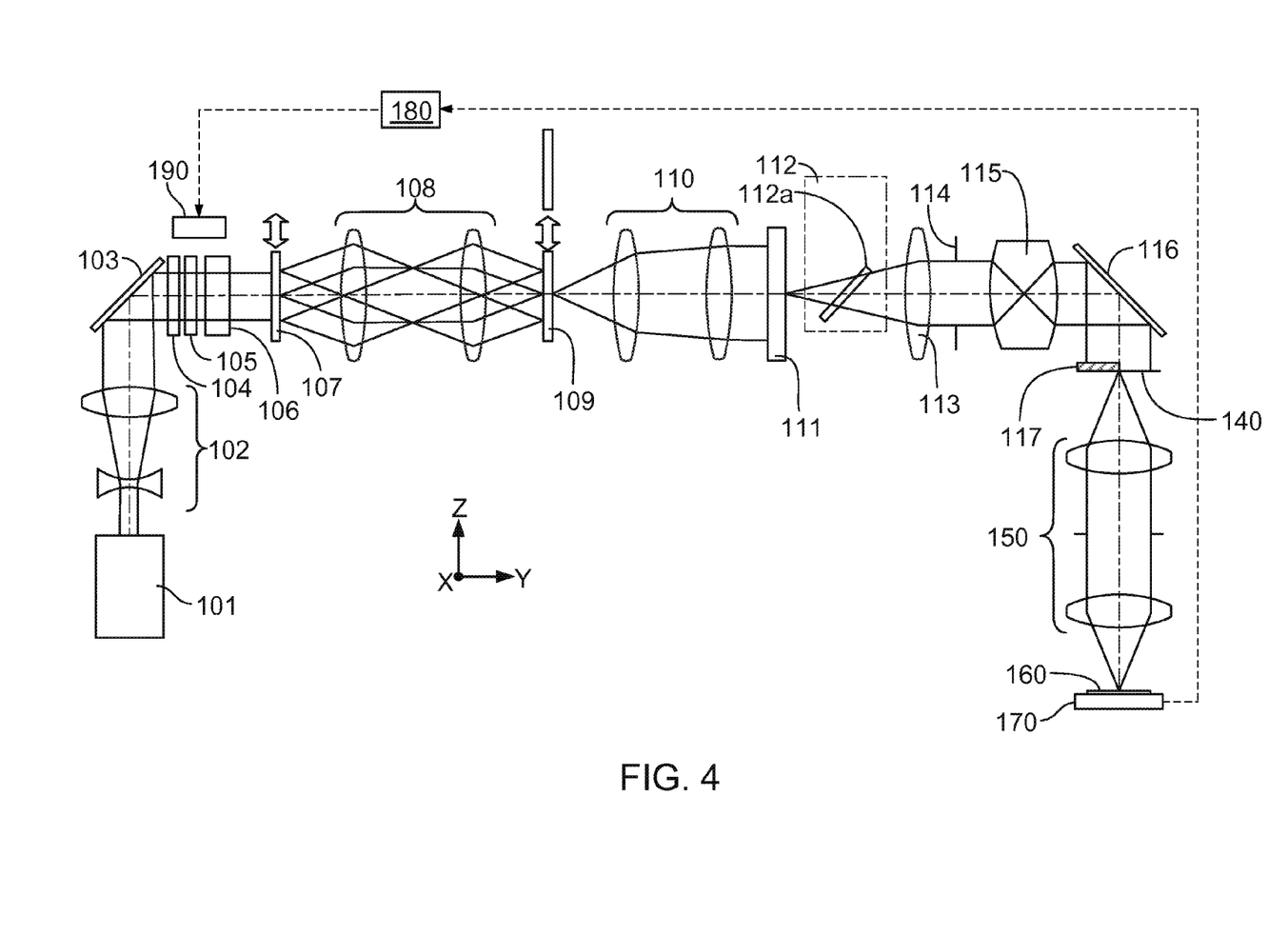
FIG. 4 shows a schematic illustration of a microlithographic projection exposure apparatus in accordance with a further embodiment in which the method according to the disclosure is realized.

An exemplary construction of a projection exposure apparatus suitable for application of the concept according to the disclosure in such situations is illustrated in FIG. 4. This construction substantially corresponds to the construction shown in FIG. 1, but differs in so far as an additional lambda/2 plate 117 is provided at the location of the reticle plane, wherein a region of the light beam cross section of light passing through which is covered by the second lambda/2 plate 117 is variably adjustable in a manner dependent on the measurement result of the polarization measuring device 170. In accordance with FIG. 4, the second lambda/2 plate 117 for example just covers half of the optically utilized region of the reticle plane or half of the light beam cross section of the light passing through the illumination device. The optical crystal axis of the lambda/2 plate 117 is oriented parallel to the preferred direction of the polarization or perpendicular thereto.

Figure 5A:
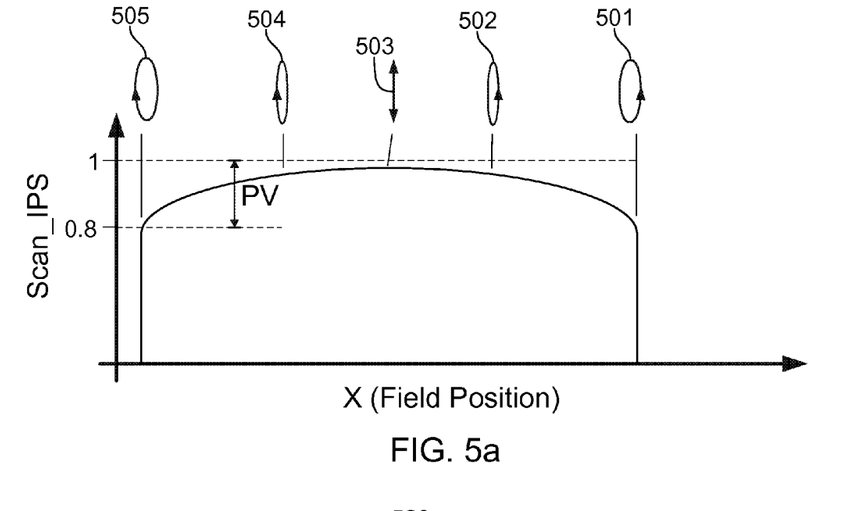
FIGS. 5-6 show diagrams each illustrating further field-dependent profiles of the scanned IPS values, before and respectively after carrying out a correction via the method according to the disclosure.

FIG. 5a then shows a situation in which, before the correction, a polarization state 503 with linearly polarized light of exactly the desired polarization direction (e.g. y direction) is present in the field center, whereas elliptically polarized light of opposite chirality is present at the mutually opposite field edges (a polarization state 505 with right elliptically polarized light at the left-hand field edge and a polarization state 501 with left elliptically polarized light at the right-hand field edge), wherein both polarization states bring about the same IPS loss (of once again approximately 20% in the example) on account of the ellipticity that is equal in magnitude and differs merely in the sign or chirality. Here the further problem then occurs that although a compensation of the ellipticity at the left-hand field edge via the lambda/4 plate 104 of the correction arrangement (by setting an ellipticity of opposite chirality) is possible, it would lead to a further impediment at the right-hand field edge, such that as a result the polarization state or the IPS value is improved in one field region only at the expense of an impediment in the other field region.

Figure 5B:
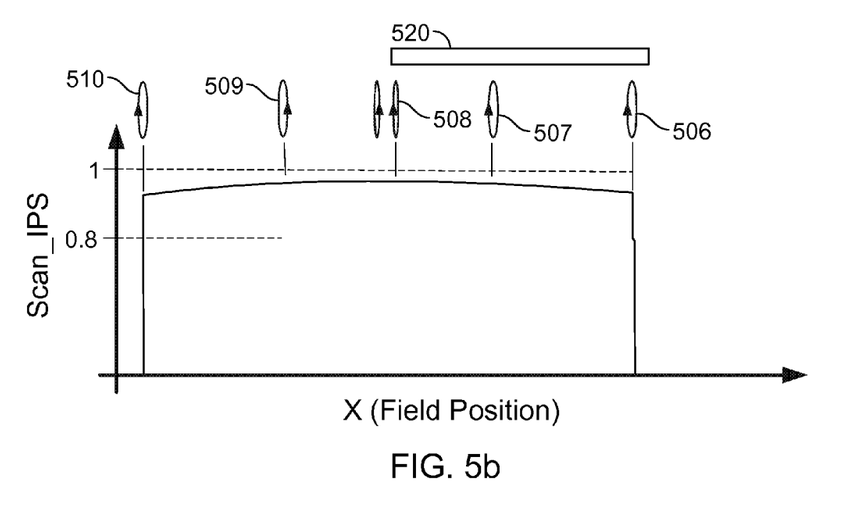

In order to overcome this problem, according to the disclosure, as illustrated in FIG. 5b, via the lambda/2 plate 520, which only extends over that part of the light beam cross section which impinges on the right-hand field region, the chirality for the polarization distributions 501, 502 present in the right-hand field region before the correction is then inverted, such that, owing to the use of the lambda/2 plate 520, the polarization states in the right-hand field region correspond to those in the left-hand field region with regard to the chirality of the ellipticity. Consequently, a polarization state 505 with right elliptically polarized light is produced at the left-hand field edge and a polarization state 501' with likewise right elliptically polarized light is produced at the right-hand field edge. This is achieved by virtue of the fact that the region having the initially "incorrect" chirality is covered by the additional lamdbda/2 plate 520 and the "correct" chirality is thus provided in this region as a result.

The correction concept analogous to FIG. 2 is then applied to the IPS distribution obtained by the effect of the lambda/2 plate 520 by virtue of the fact that a partial compensation of those polarization states which cause minimum IPS values (that is to say of the polarization states 505 and 501') is obtained by the setting of the lambda/4 plate 104, wherein, analogously to FIG. 2, the resultant improvement in the IPS profile outweighs the impediment brought about in other regions (in particular in the field center).

Figure 6A:
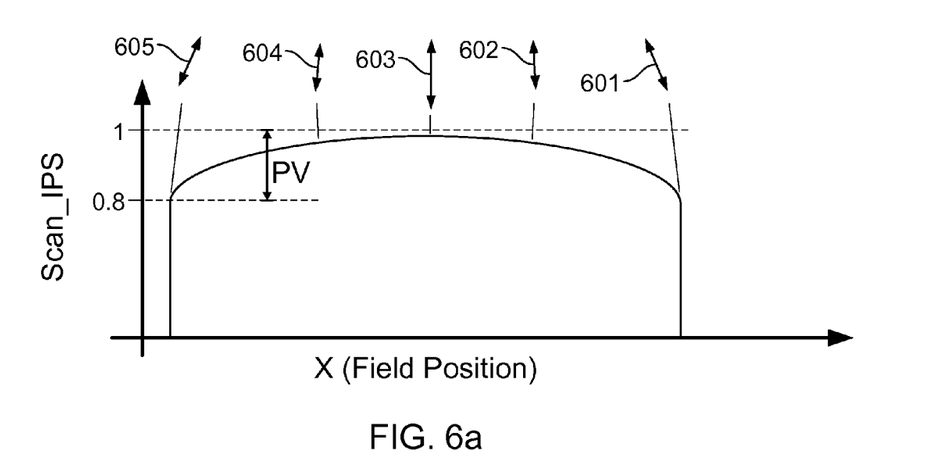
Figure 6B:
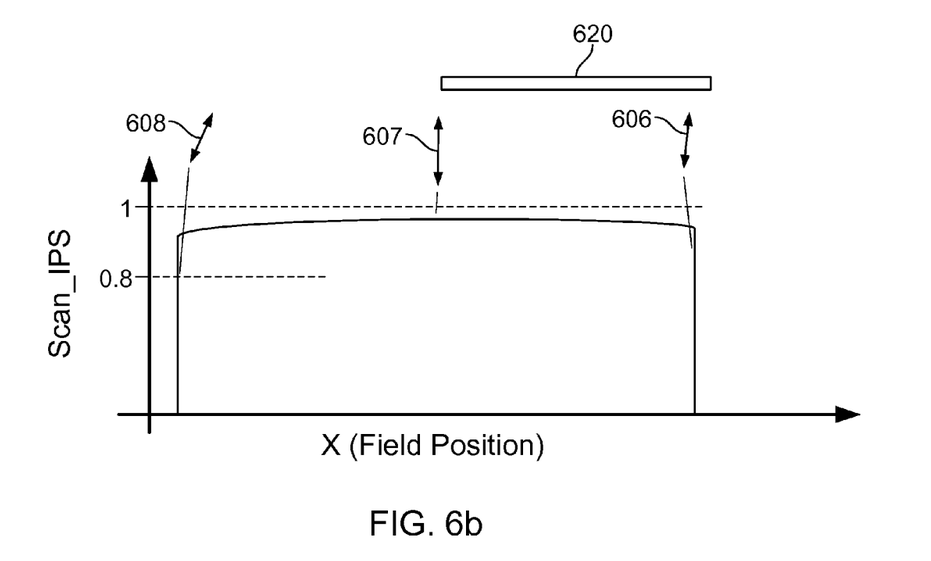

FIGS. 6a-b show an analogous exemplary embodiment for the application of the correction concept according to the disclosure in the case of an IPS profile which is symmetrical about the field center and which is based on a change in the orientation of the polarization which is symmetrical about the field center.

In this case, use is made of the fact that the orientation of the polarization is mirrored at the optical crystal axis of the lambda/2 plate 620, such that initially polarization states 605 and 601' having an identical orientation of the polarization are set at the left-hand field edge and at the right-hand field edge via the lambda/2 plate 520. The correction concept analogous to FIG. 3 is then applied to the resultant IPS distribution by virtue of the fact that a partial compensation of those polarization states which cause minimum IPS values (that is to say of the polarization states 605 and 601') is obtained by the setting of the lambda/4 plate 104 with regard to the orientation of the polarization, wherein, analogously to FIG. 3, the resultant improvement in the IPS profile outweighs the impediment brought about in other regions (in particular in the field center).

Even though the disclosure has been described on the basis of specific embodiments, numerous variations and alternative embodiments can be deduced by the person skilled in the art, e.g. by combination and/or exchange of features of individual embodiments. Accordingly, it goes without saying for the person skilled in the art that such variations and alternative embodiments are also encompassed by the present disclosure, and the scope of the disclosure is only restricted within the meaning of the accompanying patent claims and the equivalents thereof.

What is claimed is:
1. A method, comprising:
providing a microlithographic projection exposure apparatus, comprising:
an illumination device having an optical axis, the illumination device comprising:
a correction arrangement, comprising:
a lambda/4 plate; and/or
a lambda/2 plate; and
a projection objective;
determining a polarization distribution in a plane of the microlithographic projection exposure apparatus;
determining parameter values from the polarization distribution in the plane, wherein a parameter value is a ratio of intensity of light in a polarization state to the total intensity of light at a location in the plane;
determining average parameter values, wherein an average parameter value is an average of parameter values at locations along a scanning direction of the microlithographic projection exposure apparatus;
determining a difference between a maximum value and a minimum value of the average parameter values, and
rotating an element about the optical axis to reduce a local variation of the polarization distribution in the plane to provide a polarization distribution in the plane which is closer to a desired polarization distribution in the plane than is the determined polarization distribution in the plane,
wherein:
the element comprises at least one element selected from the group consisting of the lambda/4 plate and the lambda/2 plate; and
the element is rotated to reduce the difference between the maximum value and the minimum value of the average parameter values, thereby providing the polarization distribution in the plane which is closer to the desired polarization distribution in the plane than is the determined polarization distribution in the plane.

2. The method of claim 1, wherein the plane lies at least in direct proximity to a field plane.

3. The method of claim 2, wherein the field plane is a reticle plane or a wafer plane.

4. The method of claim 1, wherein the element is rotated so that, in a local distribution of a parameter (IPS) that is characteristic of a degree of realization of a specific polarization state in the plane, the difference between a maximum value of a parameter (IPS PV) and a minimum value of the parameter (IPS PV) is reduced by at least 10%.

5. The method of claim 1, wherein the illumination device comprises a changing device configured to change an angle distribution of light passing through the illumination device, and the correction arrangement is arranged upstream of the changing device in a light propagation direction through the illumination device.

6. The method of claim 5, wherein the changing device comprises a diffractive optical element.

7. The method of claim 5, wherein the changing device comprises a mirror arrangement which comprises a multiplicity of adjustable mirrors.

8. The method of claim 1, further comprising introducing a retardation element into a beam path so that the retardation element extends only over a partial region of a cross section of light.

9. The method of claim 8, wherein the retardation element is a lambda/2 plate.

10. The method of claim 8, wherein the region of the cross section of the light which is covered by the retardation element is set in a manner dependent on the determined polarization distribution.

11. The method of claim 1, wherein rotating the element comprises:
rotating the lambda/4 plate about the optical axis; and
rotating the lambda/2 plate about the optical axis.

12. The method of claim 1, further comprising, before rotating the element, determining the desired polarization distribution in the plane.

13. A method, comprising:
using a microlithographic projection exposure apparatus to produce microstructured components, the microlithographic projection exposure apparatus comprising:
an illumination device having an optical axis, the illumination device comprising:
a correction arrangement, comprising:
a lambda/4 plate; and/or
a lambda/2 plate;
a projection objective;
a polarization measuring device configured to determine a polarization distribution in a plane of the microlithographic projection exposure apparatus; and
a retardation element configured so that, during use of the apparatus, a region of a cross section of light covered by the retardation element is variably adjustable in a manner dependent on a measurement result of the polarization measuring device,
wherein using the microlithographic projection exposure apparatus comprises:
determining parameter values from the polarization distribution in the plane, wherein a parameter value is a ratio of intensity of light in a polarization state to the total intensity of light at a location in the plane;
determining average parameter values, wherein an average parameter value is an average of parameter values at locations along a scanning direction of the microlithographic projection exposure apparatus;
determining a difference between a maximum value and a minimum value of the average parameter values; and
rotating an element about the optical axis to reduce the difference between the maximum value and the minimum value of the average parameter values; and
wherein the element comprises at least one element selected from the group consisting of the lambda/4 plate and the lambda/2 plate.

14. The method of claim 13, wherein rotating the element comprises:
rotating the lambda/4 plate about the optical axis; and
rotating the lambda/2 plate about the optical axis.

15. The method of claim 13, wherein the plane lies at least in direct proximity to a field plane.

16. The method of claim 15, wherein the field plane is a reticle plane or a wafer plane.

17. The method of claim 13, wherein the illumination device comprises a changing device configured to change an angle distribution of light passing through the illumination device, and the correction arrangement is arranged upstream of the changing device in a light propagation direction through the illumination device.

18. The method of claim 17, wherein the changing device comprises a diffractive optical element.

19. The method of claim 17, wherein the changing device comprises a mirror arrangement which comprises a multiplicity of adjustable mirrors.

20. The method of claim 13, further comprising introducing a retardation element into a beam path so that the retardation element extends only over a partial region of a cross section of light.

21. The method of claim 20, wherein the retardation element is a lambda/2 plate.

22. The method of claim 20, wherein the region of the cross section of the light which is covered by the retardation element is set in a manner dependent on the determined polarization distribution.

23. The method of claim 13, further comprising, before rotating the element, determining the desired polarization distribution in the plane.

24. The method of claim 13, wherein the element is rotated so that, in a local distribution of a parameter (IPS) that is characteristic of a degree of realization of a specific polarization state in the plane, the difference between a maximum value of a parameter (IPS PV) and a minimum value of the parameter (IPS PV) is reduced by at least 10%.

25. A method, comprising:
providing a microlithographic projection exposure apparatus, comprising:
an illumination device having an optical axis, the illumination device comprising:
a correction arrangement, comprising:
a lambda/4 plate; and/or
a lambda/2 plate; and
a projection objective;
determining a polarization distribution in a plane of the microlithographic projection exposure apparatus; and
rotating an element about the optical axis to reduce a local variation of the polarization distribution in the plane to provide a polarization distribution in the plane which is closer to a desired polarization distribution in the plane than is the determined polarization distribution in the plane,
wherein:
the element comprises at least one element selected from the group consisting of the lambda/4 plate and the lambda/2 plate; and
the element is rotated so that, in a local distribution of a parameter (IPS) that is characteristic of a degree of realization of a specific polarization state in the plane, the difference between a maximum value of a parameter (IPS PV) and a minimum value of the parameter (IPS PV) is reduced by at least 10%.

26. The method of claim 25, wherein the plane lies at least in direct proximity to a field plane.

27. The method of claim 26, wherein the field plane is a reticle plane or a wafer plane.

28. The method of claim 25, wherein the illumination device comprises a changing device configured to change an angle distribution of light passing through the illumination device, and the correction arrangement is arranged upstream of the changing device in a light propagation direction through the illumination device.

29. The method of claim 28, wherein the changing device comprises a diffractive optical element.

30. The method of claim 28, wherein the changing device comprises a mirror arrangement which comprises a multiplicity of adjustable mirrors.

31. The method of claim 25, further comprising introducing a retardation element into a beam path so that the retardation element extends only over a partial region of a cross section of light.

32. The method of claim 31, wherein the retardation element is a lambda/2 plate.

33. The method of claim 31, wherein the region of the cross section of the light which is covered by the retardation element is set in a manner dependent on the determined polarization distribution.

34. The method of claim 25, wherein rotating the element comprises:
   rotating the lambda/4 plate about the optical axis; and
   rotating the lambda/2 plate about the optical axis.

35. The method of claim 25 further comprising, before rotating the element, determining the desired polarization distribution in the plane.

* * * * *

UNITED STATES PATENT AND TRADEMARK OFFICE
CERTIFICATE OF CORRECTION

PATENT NO. : 9,128,389 B2  
APPLICATION NO. : 13/010145  
DATED : September 8, 2015  
INVENTOR(S) : Damian Fiolka Page 1 of 1

It is certified that error appears in the above-identified patent and that said Letters Patent is hereby corrected as shown below:

Title Page, Item (54) and in the Specification, Col. 1, line 2, in the Title, after "IN", insert -- A --.

In the Specification

Col. 4, line 43, delete "micro structured" and insert -- microstructured --.

Col. 5, line 59, delete "lamba/2" and insert -- lambda/2 --.

Col. 6, line 28, delete "lamba/4" and insert -- lambda/4 --.

Col. 8, line 31, delete "lamba/2" and insert -- lambda/2 --.

Col. 9, line 23, delete "lamdbda/2" and insert -- lambda/2 --.

Signed and Sealed this  
Eighth Day of March, 2016

Michelle K. Lee  
*Director of the United States Patent and Trademark Office*